(12) United States Patent
Thor et al.

(10) Patent No.: US 8,035,074 B2
(45) Date of Patent: Oct. 11, 2011

(54) AUTOMATIC GAIN CONTROL FOR MOTION ENCODER SIGNALS

(75) Inventors: Chung Min Thor, Riduzan (MY); Mei Yee Ng, Perak (MY); Gim Eng Chew, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 386 days.

(21) Appl. No.: 12/368,299

(22) Filed: Feb. 9, 2009

(65) Prior Publication Data

US 2010/0201422 A1 Aug. 12, 2010

(51) Int. Cl.
*H03G 3/20* (2006.01)
*G01D 5/34* (2006.01)

(52) U.S. Cl. .............................. 250/214 AG; 250/231.1

(58) Field of Classification Search ............ 250/214 AG, 250/559.12, 559.29, 206, 206.1, 214 R, 214.1, 250/214 C, 221, 231.1, 231.18, 237 G; 327/306, 327/323, 291, 362, 363; 340/535, 534; 341/11, 341/13, 14, 143, 155, 180, 187; 33/1 N, 33/1 M, 1 PT; 356/616–619

See application file for complete search history.

(56) References Cited

U.S. PATENT DOCUMENTS

| 4,078,173 | A | * | 3/1978 | Fultz ........................ 250/237 G |
| 4,593,194 | A | * | 6/1986 | Graham et al. .......... 250/231.16 |
| 4,606,008 | A | * | 8/1986 | Wason ........................... 702/151 |
| 4,751,383 | A | * | 6/1988 | Ueyama .................... 250/237 G |
| 5,063,291 | A | * | 11/1991 | Buehring ................ 250/231.16 |
| 6,081,603 | A |   | 6/2000 | Engh et al. |
| 6,240,283 | B1 |   | 5/2001 | Holcombe |
| 6,664,841 | B1 |   | 12/2003 | Cetin et al. |
| 2006/0209991 | A1 | * | 9/2006 | Oshikubo et al. .............. 375/330 |
| 2007/0004359 | A1 |   | 1/2007 | Srinivasan et al. |
| 2007/0026829 | A1 |   | 2/2007 | Kim et al. |
| 2007/0210864 | A1 |   | 9/2007 | Hirabayashi et al. |

\* cited by examiner

*Primary Examiner* — Que T Le
*Assistant Examiner* — Jennifer Bennett

(57) ABSTRACT

Disclosed are various embodiments of pulse generation and automatic gain control ("AGC") circuits and corresponding methods that are especially well suited for use in motion encoding systems. Analog output signals provided by a motion encoder serve as inputs to the pulse generation circuit, where peaks, valleys and/or crosspoints corresponding to such analog signals are first detected and then employed to generate output pulses corresponding thereto. These output pulses are next provided to an AGC circuit as self-generated clock signals which control the time windows over which the analog signals of the motion encoder are sampled and processed by the AGC circuit so as to adjust the gains applied to such analog signals.

20 Claims, 6 Drawing Sheets

AUTOMATIC GAIN CONTROL FOR MOTION ENCODER SIGNALS

FIELD OF THE INVENTION

Various embodiments of the inventions described herein relate to the field of motion encoders, and components, devices, systems and methods associated therewith.

BACKGROUND

In some incremental motion encoding systems of the prior art, automatic gain control ("AGC") is employed to control and maintain a desired gain or range of gains applied to analog signals provided by an encoding system. The gain provided by such a system may change due to effects arising from manufacturing variations, ambient temperature changes, and aging. Attempts have been made to correct such effects, typically by employing relatively complicated AGC circuitry. For example, external clocks have been incorporated into circuitry configured to detect the peaks or valleys of analog signals provided by motion encoders. Other or additional approaches to AGC in motion encoding systems include using analog-to-digital converters ("ADCs"), microcontrollers, and firmware calibration, where such approaches typically involve providing external clock signals. Such AGC implementations may feature several disadvantages, such as increased complexity, power consumption, noise, die size and cost. What is needed are smaller, less complex motion encoding systems capable of effecting at least adequate AGC, but which also feature lower power consumption and lower manufacturing costs.

SUMMARY

In some embodiments, there is provided a method of applying automatic gain control ("AGC") to a plurality of analog signals generated by a motion encoder comprising generating, with the motion encoder, a plurality of output analog signals that are out of phase respecting one another, the analog output signals having peaks and valleys corresponding thereto, providing the analog output signals to a pulse generation circuit, generating, with the pulse generation circuit, digital pulses corresponding to the peaks and valleys of the analog output signals, and employing, in an AGC circuit, the generated digital pulses as clock signals to control sampling of and adjust gains applied to at least one of the analog output signals.

In other embodiments, there is provided a motion encoding system configured to apply automatic gain control ("AGC") to a plurality of analog output signals comprising a motion encoder configured to generate the plurality of analog is output signals, each of such signals being out of phase respecting the others, each of the analog output signals having peaks and valleys corresponding thereto, a pulse generation circuit operably connected to the motion encoder and configured to receive the analog output signals therefrom, the pulse generation circuit being configured to generate digital pulses corresponding to the peaks and valleys of the analog output signals, and an AGC circuit configured to receive the digital pulses and employ the digital pulses as clock signals to control sampling of and adjust gains applied to at least one-of the analog output signals.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTION OF SOME PREFERRED EMBODIMENTS

In the various embodiments described and disclosed herein, automatic gain control ("AGC") is employed to detect and to adjust the amplification or gain applied to analog signals provided by a motion encoder so that appropriate amplification or gain is applied to such analog signals regardless of manufacturing process variations, temperature variations, aging, and other undesired effects.

Figure 1:
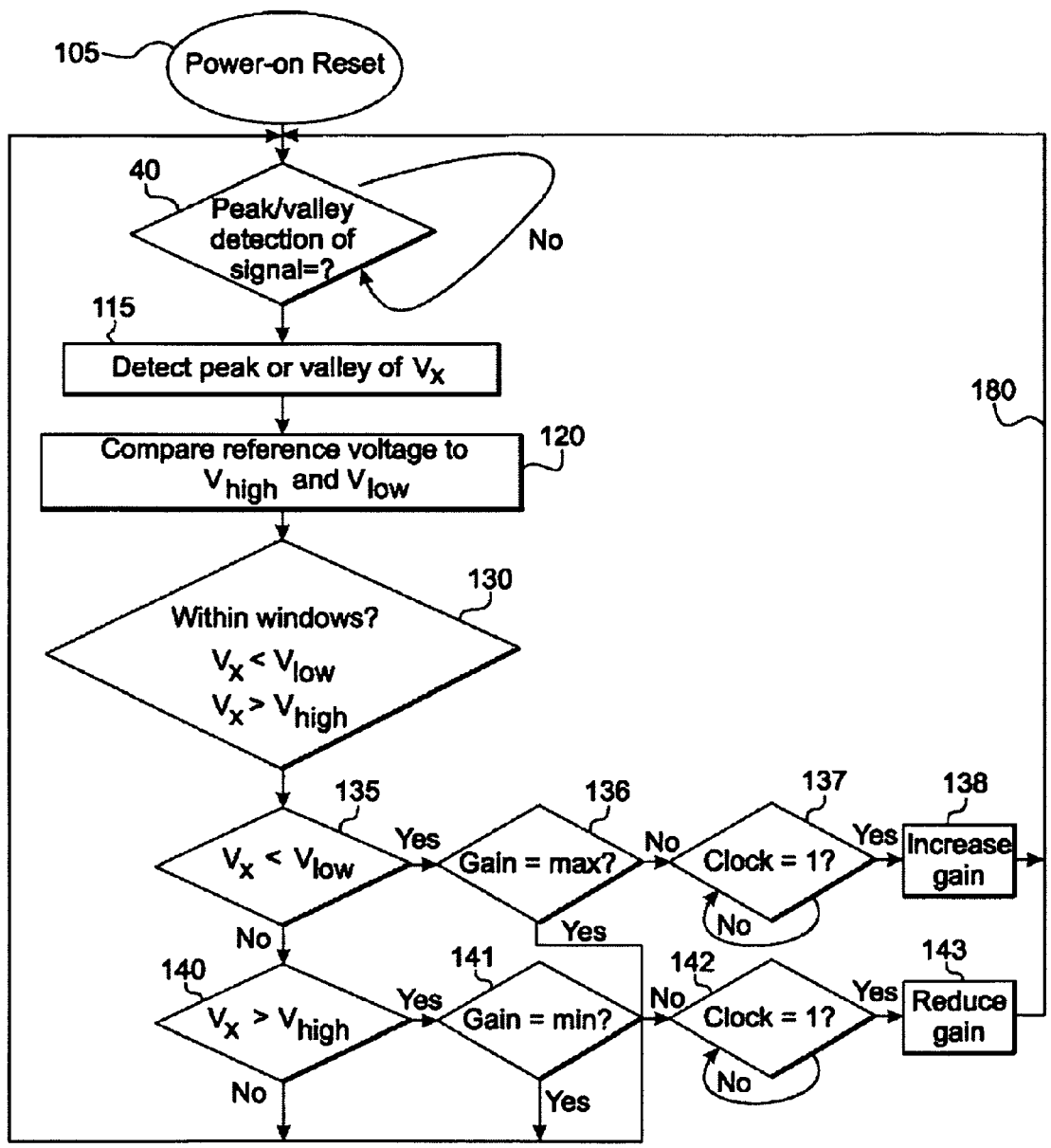
FIG. 1 shows a first method according to one embodiment of the invention.
Figure 2:
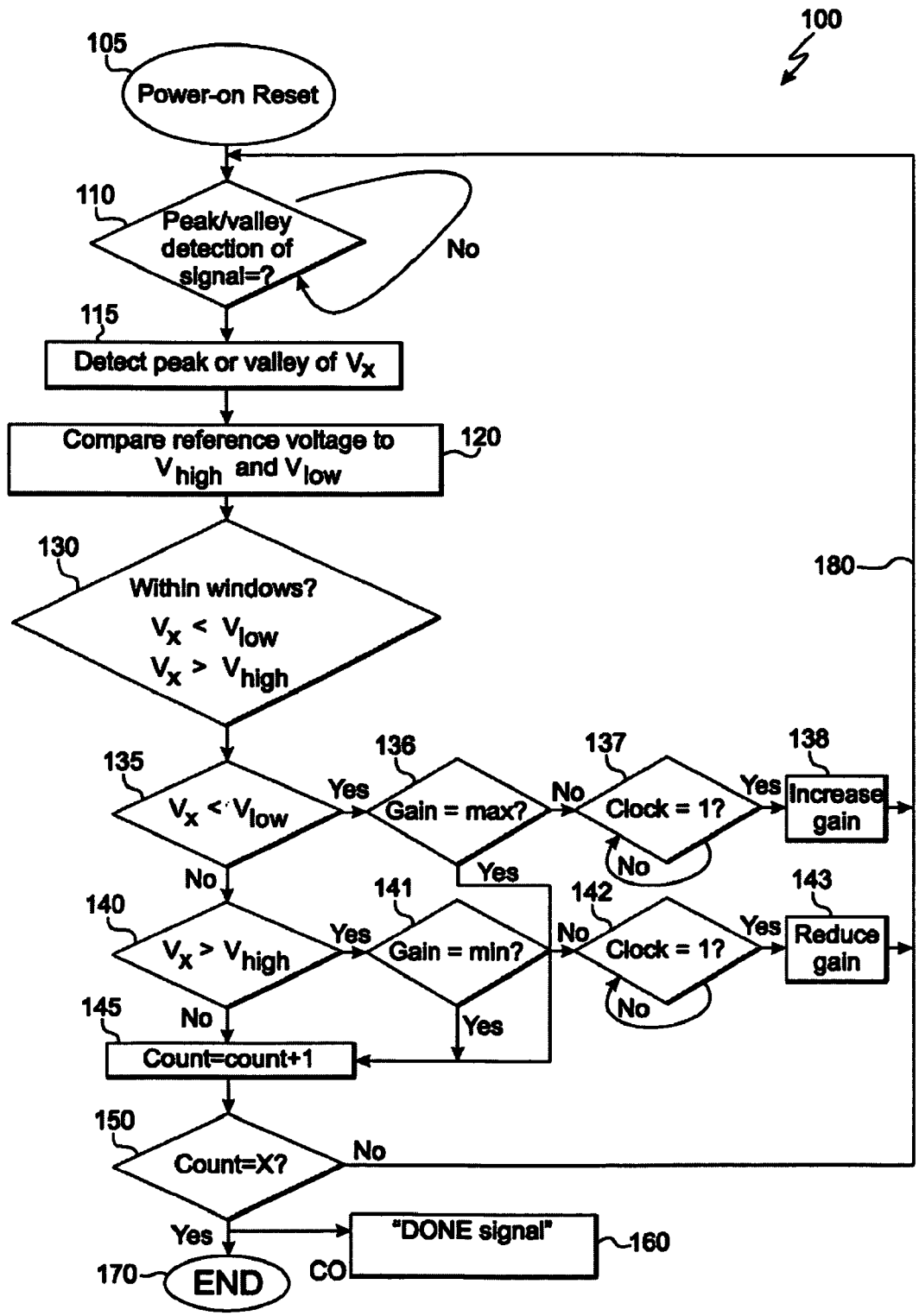
FIG. 2 shows a second method according to one embodiment of the invention.

FIG. 1 shows a first method 100 according to one embodiment of the invention, where steps corresponding to the operation of a motion encoding system are disclosed. A detection signal corresponding to a peak or valley of an analog signal $V_x$ output by a motion encoder is generated at step 110 upon the motion encoding system being powered up or reset at step 105. When the peak or valley of the analog signal $V_x$ provided by the motion encoder is detected at step 110, the amplitude of the peak or valley of the analog signal $V_x$ is measured and compared to a reference voltage ($V_{ref}$) at step 120, where $V_{ref}$ is a predetermined voltage corresponding to the peak or valley of the analog signal $V_x$. If at step 135 the amplitude of the analog signal $V_x$ is lower than $V_{ref}$ according to the quantity $V_{low}=V_{ref}-\Delta V$ the gain applied to $V_x$ by an amplifier is increased at steps 136 through 138 when a self-generated clock signal generated by a detection circuit (discussed below) is provided to the AGC circuit (also discussed below). If at step 140 the amplitude of the analog signal $V_x$ is higher than $V_{ref}$ according to the quantity $V_{high}=V_{ref}+\Delta V$, the gain applied to $V_x$ by the amplifier is reduced at steps 141 through 143 when the self-generated clock signal is provided to the AGC circuit. If at step 130 the amplitude of the analog signal $V_x$ falls within a predetermined range around $V_{ref}$, no action is taken and the gain of the amplifier remains the same. In addition, if at step 130 $V_x > V_{high}$ or $V_x < V_{low}$ while the gain of the amplifier is at a maximum or minimum, no action is taken and the gain of the amplifier remains unchanged. Operation of the loop shown in FIG. 1 continues until the motion encoding system is powered or turned off (as shown at step 170). Additional steps, circuitry and features can be added to the pulse generation and automatic gain control circuits of the invention to enhance the operation of the motion encoding system depicted in FIG. 1. For example, and as shown in FIG. 2, a counter may be added to the motion encoding system at step 145 to terminate automatic gain control and generate a "DONE" signal when the desired count X has been achieved according to the particular application at hand. The "DONE" signal can also be used to control switches that enable or disable peak, valley and/or crosspoint detection, as is discussed below in connection with FIG. 4.

FIGS. 1 and 2 describe methods of applying automatic gain control ("AGC") to a plurality of analog signals generated by a motion encoder which comprise generating, with the motion encoder, a plurality of analog output signals that are out of phase respecting one another. The analog output signals have peaks and valleys corresponding thereto. The analog control signals are provided to a pulse generation circuit 200 (described below) which generates digital pulses corresponding to the peaks and valleys of the analog control signals. In an AGC circuit 300 (described below), the digital pulses are provided as clock signals to control sampling of and adjust gains applied to at least one of the analog motion signals.

Unlike in the prior art, where external clock signals provided by external oscillators and the like provide timing signals for AGC in a motion encoding system, in the various embodiments disclosed herein, peaks (or positive amplitude maxima), valleys (or negative amplitude minima) and crosspoints of analog signals output by a motion encoder are sensed and detected during time windows that are determined according to internally-generated clock signals provided by a pulse generation or detection circuit which forms a portion of the motion encoding system. As a result, no separate oscillator circuit is required in the system, resulting in reduced circuit complexity, space requirements and cost. In addition, the various embodiments of the motion encoding system of the invention feature improved performance because noise is not generated by an external oscillator circuit, and no additional current is drawn by such an external oscillator circuit. Moreover, the detection or pulse signals which determine the time windows during which peaks, valleys and crosspoints are to be detected are self-generated. If any mismatches or changes occur in the output analog signals provided by the motion encoder, the detection or pulse signal is changed or adjusted automatically to compensate for the mismatches or changes. In prior art AGC circuits such self compensation cannot occur because timing or clock signals are generated by an external system or oscillator circuit.

Figure 3:
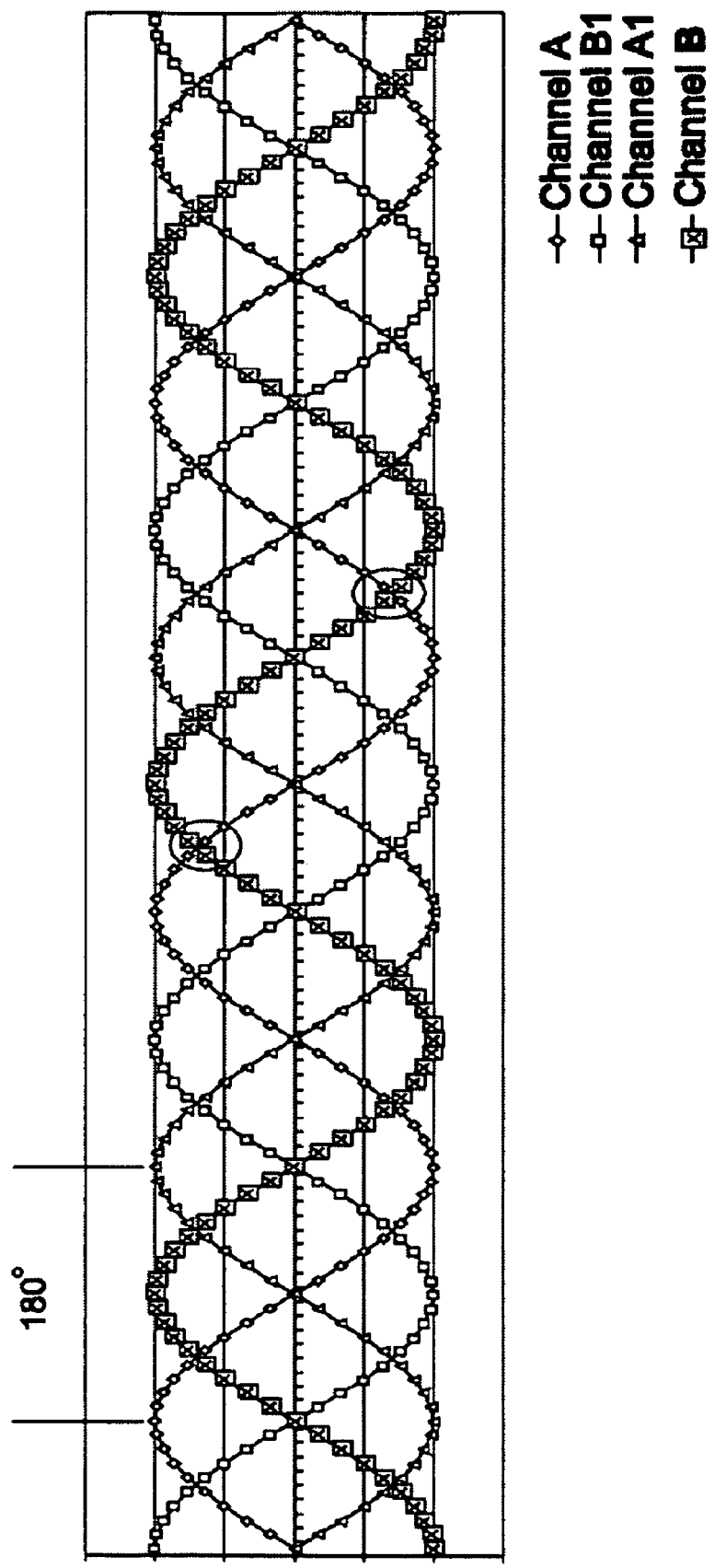
FIG. 3 shows analog motion signals provided by a motion encoder according to one embodiment of the invention.

FIG. 3 shows one example of analog output signals A, A/, B and B/ provided by a motion encoder in accordance with one embodiment of the invention. Consistent with usual conventions employed in some motion encoders, FIG. 3 shows that analog output signals A and A/ are 180 degrees out of phase with respect to one another, analog output signals B and B/ are 180 degrees out of phase with respect to one another, analog output signals A and B are 90 degrees out of phase with respect to one another, and analog output signals A/ and B/ are 90 degrees out of phase with respect to one another. As shown in FIG. 3, the sine output signal is labeled as Channel A, the inverse of the sine output signal is labeled as Channel A/, the cosine output signal is labeled as Channel B, and the inverse of the cosine output signal is labeled as Channel B/. Note that the AGC concepts disclosed herein are applicable to any suitable form of analog output signal provided by a motion encoder, including, but not limited to, sinusoidal signals, pseudo-sinusoidal signals, triangular signals, square wave signals, trapezoidal signals, and other suitable types of signals.

Figure 4:
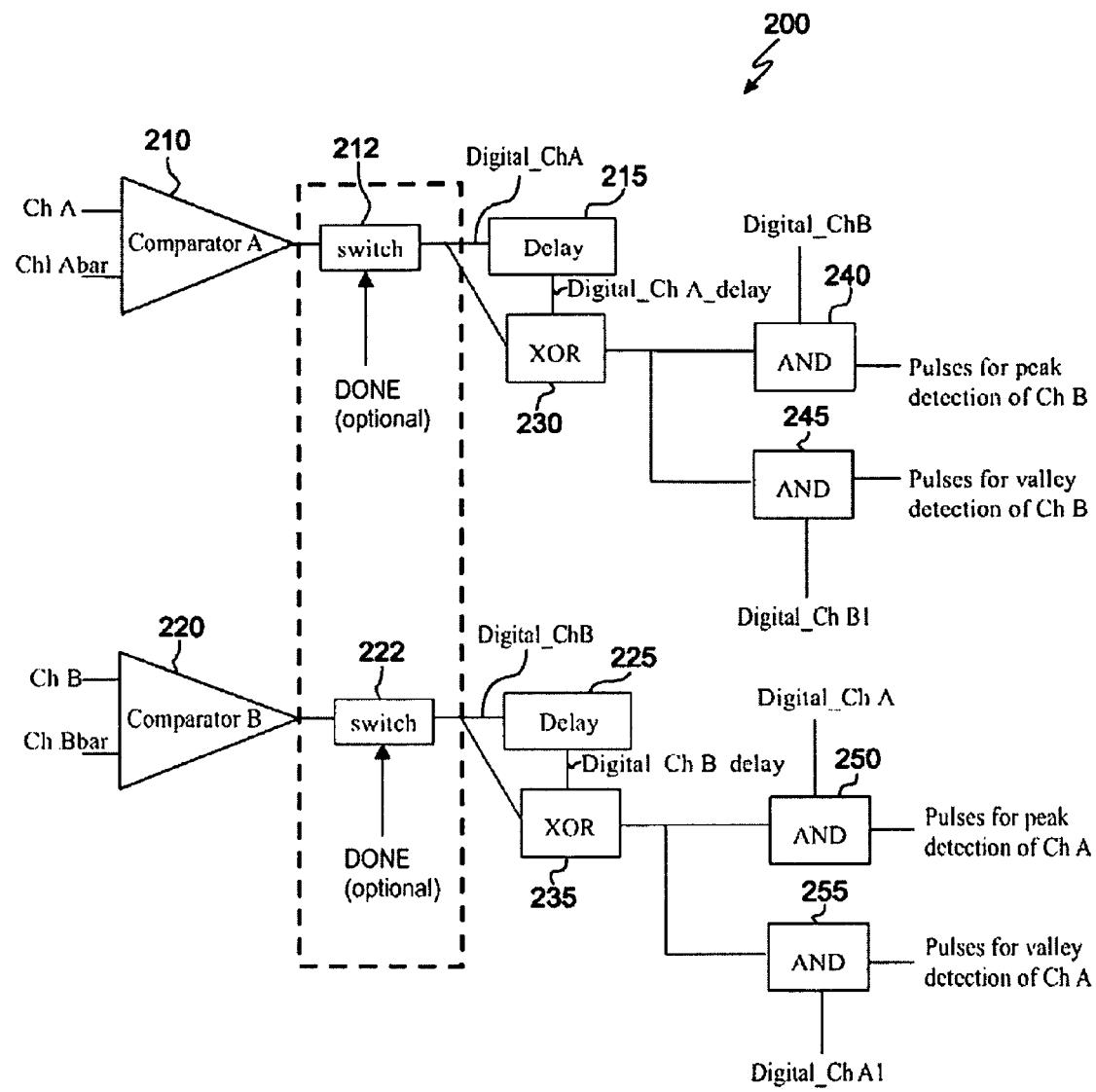
FIG. 4 shows a pulse generation circuit according to one embodiment of the invention.
Figure 5:
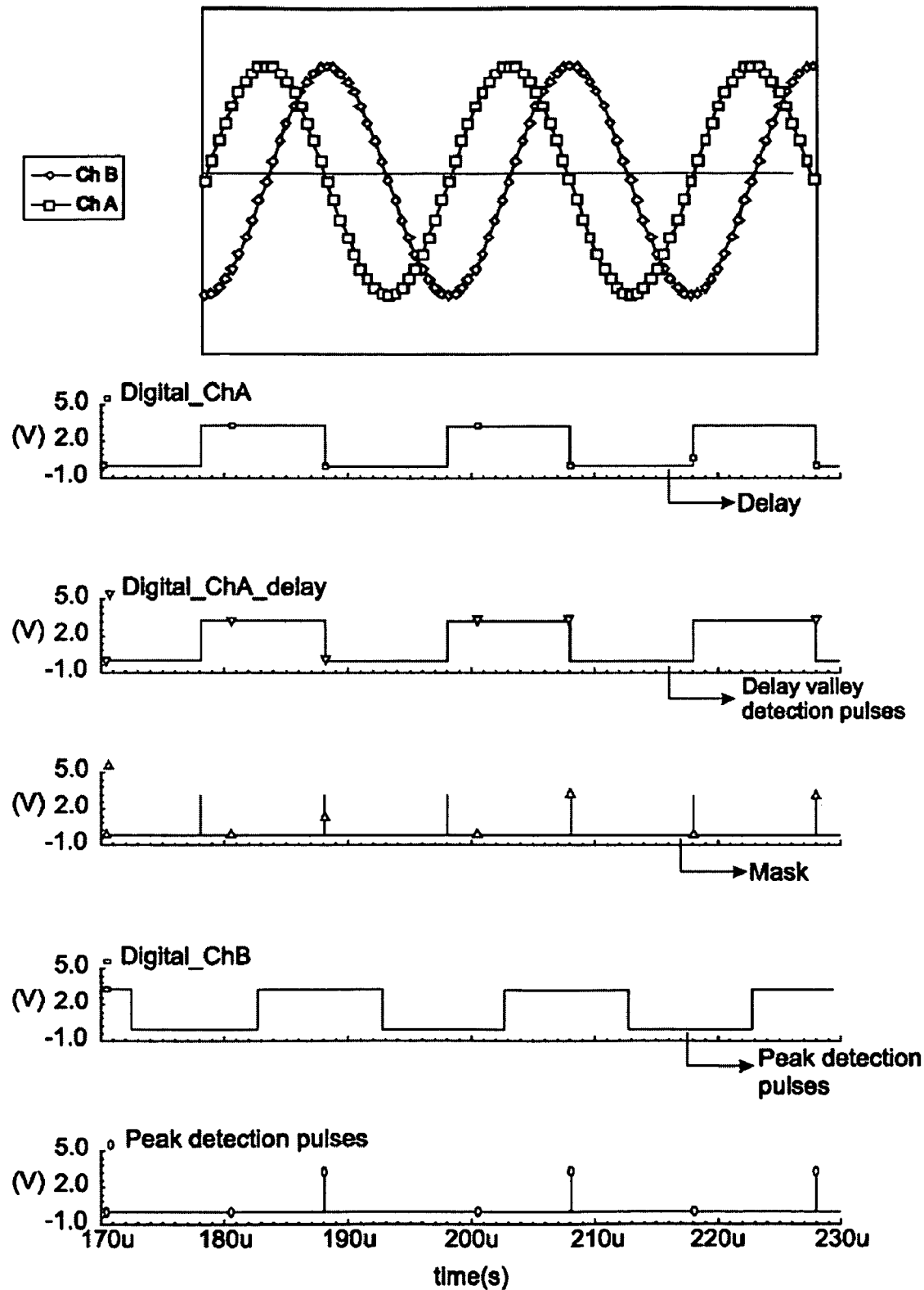
FIG. 5 shows signals provided by the detection or pulse generation circuit of FIG. 4.

Referring now to FIG. 4, there is shown one embodiment of pulse generation circuit 200, which also functions as a peak, valley, and crosspoint detection circuit. The analog output signals of FIG. 3 are provided to pulse generation circuit 200 of FIG. 4 as inputs. Comparator 210 generates Digital_Ch A and Digital_Ch A/ signals by comparing the Ch A and Ch A/ input analog signals. Delay gate 215, XOR gate 230, and AND gates 240 and 245 generate output pulses corresponding to the peaks and valleys of Ch B. Comparator 220 generates Digital_ChB and Digital_Ch B/ signals by comparing the Ch B and Ch B/ input analog signals. Delay gate 225, XOR gate 235, and AND gates 250 and 255 generate output pulses corresponding to the peaks and valleys of Ch A. Optional switches 212 and 222 may be provided and operated in accordance with the DONE signal generated using the method of FIG. 2, where AGC is to be terminated under certain conditions according to the particular application at hand. The pulses corresponding to the peaks and valleys of Ch A and Ch B can be separated by way of a masking process, as shown in FIG. 5, where some of the signals input to and output by pulse generation circuit 200 are illustrated. Similar techniques can be employed to generate pulses corresponding to the crosspoints of Ch A and Ch B illustrated in FIG. 3. Note that the generation of pulses corresponding to the valleys, peaks and/or crosspoints of input analog signals may be employed in applications other than automatic gain control in motion encoding systems, such as in RF or microwave communication and color sensing and feedback control applications.

Figure 6:
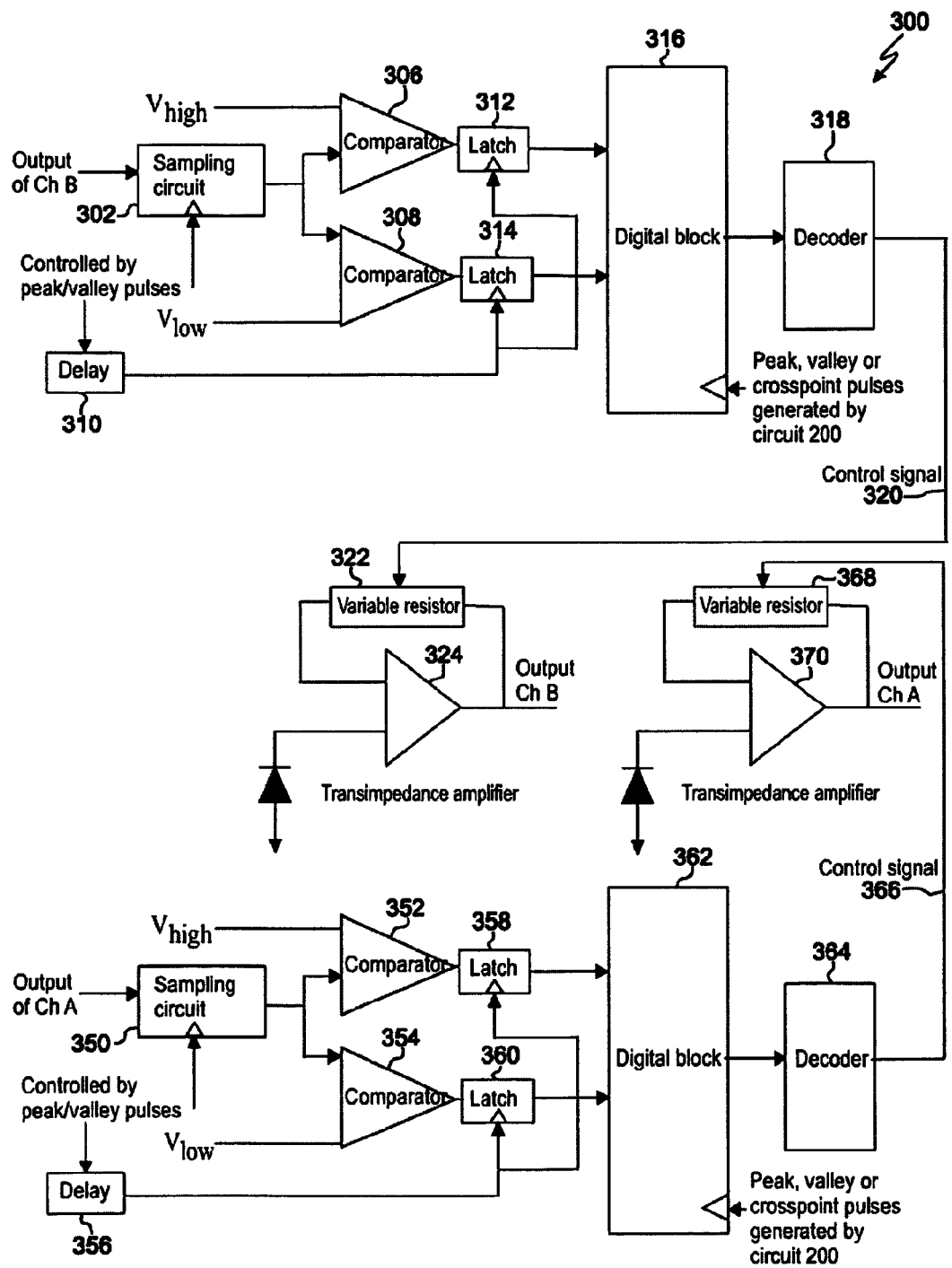
FIG. 6 shows an automatic gain control ("AGC") circuit according to one embodiment of the invention.

Referring now to FIG. 6, there is shown automatic gain control ("AGC") circuit 300 according to one embodiment of the invention. In FIG. 6, the analog output signals corresponding to Channels A and B of the motion encoder are provided to circuit 300 as inputs. Sampling circuits 302 and 350 receive analog signals corresponding to Channels B and A, and under the control of output pulse signal provided by circuit 200 of FIG. 4 corresponding to the peaks of Channel B and Channel A generated by AND gates 240 and 250 sample the voltages corresponding to the peaks of Channels B and A during time windows corresponding directly thereto. As discussed above in connection with FIGS. 1 and 2, the amplitudes of the peaks of the analog signals corresponding to Channel B and Channel A are measured and compared to reference voltages ($V_{ref}$), where $V_{ref}$ is a predetermined voltage corresponding to the peak amplitudes of Channel B and Channel A. If the amplitude of the analog signal corresponding to Channel B or Channel A is lower than $V_{ref}$ according to the quantity $V_{low}=V_{ref}-\Delta V$, the gain applied to Channel B or Channel A by amplifiers 324 or 370 is increased by AGC circuit 300. If the amplitude of the analog signal corresponding to Channel B or Channel A is higher than $V_{ref}$ according to the quantity $V_{high}=V_{ref}+\Delta V$, the gain applied to Channel A or Channel B by amplifier 324 or 370 is reduced. If the amplitude of Channel B or Channel A falls within a predetermined range around $V_{ref}$, no action is taken and the gain of amplifier 324 or 370 remains the same. In addition, if the amplitude of Channel A or Channel B exceeds $V_{high}$, or if the amplitude of Channel A or Channel B is less than $V_{low}$ while the gain of amplifier 324 or 370 is at a maximum or minimum, no action is taken and the gain of amplifier 324 or 370 remains unchanged.

In addition to receiving the outputs provided by latches 312 and 314, or latches 358 and 360, digital blocks 316 and 362 shown in FIG. 6 receive output pulses generated by circuit 200 that correspond to the peaks, valleys or crosspoints of Channel A and Channel B, which serve effectively as timing or clock signals to drive and control the operation of such blocks 316 and 362 (in addition to sampling circuits 302 and 350, which also receive pulses generated by circuit 200 that correspond to the peaks or valleys of Channel A and Channel B). The digital outputs provided by digital blocks 316 and 362 drive decoders 318 and 364 and cause decoders 316 and 362 to provide control signals 320 and 366 to variable resistors 322 and 368 and amplifiers 324 and 370 so as to increase, decrease or leave unchanged the gains applied to Channel A and Channel B.

Note that various combinations of timing or clock signals and output pulses provided by circuit 200 may be employed in digital blocks 316 and 362 of AGC circuit 300, some examples of which are shown below:

| Combination | Sampling circuit/peak and valley detection circuit | Digital block |
|---|---|---|
| Combination 1 | Peaks of Ch A & Ch B | Valleys of Ch A & Ch B |
| Combination 2 | Peaks of Ch A & Ch B | Crosspoint B |
| Combination 3 | Valleys of Ch A & Ch B | Peaks of Ch A & Ch B |
| Combination 4 | Valleys of Ch A & Ch B | Crosspoint A |

Continuing to refer to FIG. 6, and using Combination 2 shown above, for example, when the peak of output Ch B is sampled, sampling circuit 302 is controlled by peak detection pulses. The peak value of Ch B ($V_x$) is obtained by sampling circuit 302 and is compared with reference voltage $V_{ref}$. If $V_x$ is lower or higher than $V_{ref}$, the outputs of comparators 306 and 308 are maintained in latches 312 and 314 once the delay of the peak pulses has been clocked into latches 312 and 314. Digital block 316 generates an output signal to control decoder 318 that will increase, decrease or leave unchanged feedback resistor 322 of amplifier 324. The gain of amplifier 324 is updated with every pulse corresponding to the crosspoints of Channel B when $V_x$ does not lie between the two reference voltages.

In other embodiments, there is provided a motion encoding system configured to apply automatic gain control ("AGC") to a plurality of analog motion signals comprising a motion encoder configured to generate the plurality of analog motion signals, each of such signals being out of phase respecting the others, each of the analog motion signals having peaks and valleys corresponding thereto, a pulse generation circuit operably connected to the motion encoder and configured to receive the analog motion signals therefrom, the pulse generation circuit being configured to generate digital pulses corresponding to the peaks and valleys of the analog motion signals, and an AGC circuit configured to receive the digital pulses and employ the digital pulses as clock signals to control sampling of and adjust gains applied to at least one of the analog motion signals.

The various embodiments of the invention solve certain problems and have certain advantages. For example, circuits 200 and 300 may be employed to detect the peaks, valleys or crosspoints of analog signals provided by a motion encoder without any external timing or clock signals being provided thereto. External clock or timing signals are not required to effect gain correction, adjustment or compensation of motion encoder analog signals. Circuits 200 and 300 are simple, uncomplicated and may be implemented suing any of a number of different well know fabrication technologies such as CMOS, BiCMOS, and Bipolar processes. Circuits 200 and 300 result in reduced die size, cost and power consumption as fewer systems and circuits are involved. Circuits 200 and 300 may be employed to effect a regulated amplitude swing of the analog signals provided by a motion encoder over a wide range of amplitudes, depending on the particular application at hand. Circuits 200 and 300 are relatively, easy to implement with minimum manufacturing resources. Circuits 200 and 300 eliminate the need to provide separate or external clock or timing signals to pulse generation or signal detection circuits, or to AGC circuits. Circuits 200 and 300 are capable of withstanding relatively large variations in temperature. Circuits 200 and 300 provide outputs that are independent of photodiode signal variations occurring in the motion encoder. Circuits 200 and 300, properly configured, also solve the problem of dust, ink mist, and the like obscuring, covering or degrading light sensors or light emitters by adjusting light sensor amplification.

Included within the scope of the present invention are methods of making and having made the various components, devices and systems described herein.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A method of applying automatic gain control ("AGC") to a plurality of analog output signals generated by a motion encoder, comprising:
    generating, with the motion encoder, the plurality of analog output signals, such output signals being out of phase respecting one another, the plurality of analog output signals having peaks and valleys corresponding thereto;
    providing the analog output signals to a pulse generation circuit;
    generating, with the pulse generation circuit, digital pulses corresponding to the peaks and valleys of the analog output signals, and
    employing, in an AGC circuit, the generated digital pulses as clock signals to control sampling of and adjust gains applied to at least one of the analog output signals.

2. The method of claim 1, wherein the plurality of analog output signals comprise signals corresponding to Channel A, Channel A/, Channel B, and Channel B/ signals of the motion encoder.

3. The method of claim 2, further comprising providing the Channel A and Channel A/ signals to the pulse generation circuit and generating digital pulses corresponding to predetermined ones of the peaks or valleys of the Channel B or Channel B/ signals.

4. The method of claim 2, further comprising providing the Channel B and Channel B/ signals to the pulse generation circuit and generating digital pulses corresponding to predetermined ones of the peaks or valleys of the Channel A or Channel A/ signals.

5. The method of claim 2, wherein crosspoints are associated with the Channel A, Channel A/, Channel B, and Channel B/ signals, and pulses corresponding to such crosspoints are generated by the pulse generation circuit and provided to the AGC circuit to aid in controlling sampling and adjusting gains applied to at least one of the Channel A, Channel A/, Channel B, and Channel B/ signals.

6. The method of claim 5, further comprising providing the Channel B and Channel B/ signals to the pulse generation circuit and generating digital pulses corresponding to crosspoints of the Channel A or Channel B signals.

7. The method of claim 2, further comprising providing to the AGC circuit at least one predetermined reference voltage $V_{ref}$ and comparing $V_{ref}$ to at least one voltage corresponding to the Channel A, Channel A/, Channel B, or Channel B/ signals.

8. The method of claim 7, further comprising providing to the AGC circuit predetermined voltages $V_{high}$ and $V_{low}$ and comparing $V_{high}$ and $V_{low}$ to at least one voltage corresponding to the Channel A, Channel A/, Channel B, and Channel B/ signals.

9. The method of claim 8, further comprising adjusting a gain of at least one of the Channel A, Channel A/, Channel B, or Channel B/ signals by generating a control signal on the basis of comparing $V_{high}$ and $V_{low}$ to the at least one voltage and providing the control signal to a variable resistor operably connected to a transimpedance amplifier, the transimpedance amplifier being configured to increase or decrease the gain applied to the Channel A, Channel A/, Channel B, or Channel B/ signal.

10. A motion encoding system configured to apply automatic gain control ("AGC") to a plurality of analog output signals, comprising:
  a motion encoder configured to generate the plurality of analog output signals, each of such signals being out of phase respecting the others, each of the analog output signals having peaks and valleys corresponding thereto;
  a pulse generation circuit operably connected to the motion encoder and configured to receive the analog output signals therefrom, the pulse generation circuit being configured to generate digital pulses corresponding to the peaks and valleys of the analog output signals, and
  an AGC circuit configured to receive the digital pulses and employ the digital pulses as clock signals to control sampling of and adjust gains applied to at least one of the analog output signals.

11. The system of claim 10, wherein the plurality of analog output signals comprise signals corresponding to Channel A, Channel A/, Channel B, and Channel B/ signals of the motion encoder.

12. The system of claim 11, wherein the pulse generation circuit is configured to receive the Channel A and Channel A/ signals and generate digital pulses corresponding to predetermined ones of the peaks or valleys of the Channel B or Channel B/ signals.

13. The system of claim 11, wherein the pulse generation circuit is configured to receive the Channel B and Channel B/ signals and generate digital pulses corresponding to predetermined ones of the peaks or valleys of the Channel A or Channel A/ signals.

14. The system of claim 11, wherein crosspoints are associated with the Channel A, Channel A/, Channel B, and Channel B/ signals, and the pulse generation circuit is configured to generate digital pulses corresponding to such crosspoints and provide such digital pulses to the AGC circuit to aid in controlling sampling and adjusting gains applied to at least one of the Channel A, Channel A/, Channel B, and Channel B/ signals.

15. The system of claim 14, further comprising configuring the pulse generation circuit to receive the Channel B and Channel B/ signals and generate digital pulses corresponding to crosspoints of the Channel A or Channel B signals.

16. The system of claim 11, further comprising configuring the AGC circuit to provide at least one predetermined reference voltage $V_{ref}$ and compare $V_{ref}$ to at least one voltage corresponding to the Channel A, Channel A/, Channel B, or Channel B/ signals.

17. The system of claim 16, further comprising configuring the AGC circuit to provide predetermined voltages $V_{high}$ and $V_{low}$ and compare $V_{high}$ and $V_{low}$ to at least one voltage corresponding to the Channel A, Channel A/, Channel B, and Channel B/ signals.

18. The system of claim 17, further comprising configuring the AGC circuit to adjust a gain of at least one of the Channel A, Channel A/, Channel B, or Channel B/ signals by generating a control signal on the basis of comparing $V_{high}$ and $V_{low}$ to the at least one voltage and providing the control signal to a variable resistor operably connected to a transimpedance amplifier, the transimpedance amplifier being configured to increase or decrease the gain applied to the Channel A, Channel A/, Channel B, or Channel B/ signal.

19. The system of claim 11, wherein no separate or external oscillator or clock circuit is operably coupled to or included in the AGC circuit.

20. The system of claim 11, wherein the pulse generation circuit and the AGC circuit are incorporated into a single integrated circuit, the integrated circuit further not comprising a separate or external oscillator or clock circuit operably coupled to or included in the AGC circuit.

* * * * *